United States Patent
Baek et al.

(10) Patent No.: US 11,387,317 B2
(45) Date of Patent: Jul. 12, 2022

(54) FIELD-EFFECT TRANSISTOR WITHOUT PUNCH-THROUGH STOPPER AND FABRICATION METHOD THEREOF

(71) Applicant: POSTECH Research and Business Development Foundation, Pohang-si (KR)

(72) Inventors: Rock Hyun Baek, Pohang-si (KR); Jun Sik Yoon, Pohang-si (KR); Jin Su Jeong, Daegu (KR); Seung Hwan Lee, Busan (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 36 days.

(21) Appl. No.: 16/750,292

(22) Filed: Jan. 23, 2020

(65) Prior Publication Data
US 2020/0243644 A1  Jul. 30, 2020

(30) Foreign Application Priority Data

Jan. 30, 2019  (KR) .................. 10-2019-0011571

(51) Int. Cl.
  *H01L 29/06* (2006.01)
  *H01L 29/66* (2006.01)
  *H01L 29/78* (2006.01)
(52) U.S. Cl.
  CPC ...... *H01L 29/0653* (2013.01); *H01L 29/6653* (2013.01); *H01L 29/6681* (2013.01); *H01L 29/66795* (2013.01); *H01L 29/785* (2013.01); *H01L 29/7853* (2013.01)

(58) Field of Classification Search
  CPC ............ H01L 29/0653; H01L 29/6653; H01L 29/66795; H01L 29/6681; H01L 29/785; H01L 29/7853
  See application file for complete search history.

(56) References Cited

U.S. PATENT DOCUMENTS

| | | | |
|---|---|---|---|
| 9,935,197 B2 * | 4/2018 | Chang | H01L 29/66636 |
| 9,947,804 B1 * | 4/2018 | Frougier | H01L 21/823412 |
| 9,954,107 B2 * | 4/2018 | Cheng | H01L 29/1054 |
| 9,991,352 B1 | 6/2018 | Frougier et al. | |
| 10,256,158 B1 * | 4/2019 | Frougier | H01L 27/1203 |

(Continued)

FOREIGN PATENT DOCUMENTS

| | | |
|---|---|---|
| KR | 20030070329 | 8/2003 |
| KR | 101912839 | 12/2018 |
| WO | 2018-059912 | 4/2018 |

OTHER PUBLICATIONS

Xin Qi et al., "Mesoporous bioactive glass-coated 3D printed borosilicate bioactive glass scaffolds for improving repair of bone defects", International Journal of Biological Sciences 2018; 14(4): 471-484.

(Continued)

*Primary Examiner* — Christine A Enad
(74) *Attorney, Agent, or Firm* — Lex IP Meister, PLLC

(57) ABSTRACT

Disclosed is a field effect transistor including an insulating film disposed between a source/drain region and a substrate. Since the insulating film prevents current leakage under a channel, it is not necessary to form a punch-through stopper. Further disclosed is a method of forming a field effect transistor.

5 Claims, 8 Drawing Sheets

(56) References Cited

U.S. PATENT DOCUMENTS

| | | | |
|---|---|---|---|
| 2005/0250279 A1* | 11/2005 | Son | H01L 29/66621 |
| | | | 438/216 |
| 2008/0145989 A1 | 6/2008 | Oh et al. | |
| 2012/0093895 A1 | 4/2012 | Song et al. | |
| 2016/0297935 A1 | 10/2016 | Reese et al. | |
| 2016/0329429 A1* | 11/2016 | Cheng | H01L 29/7851 |
| 2018/0327552 A1 | 11/2018 | Reese et al. | |
| 2018/0370165 A1 | 12/2018 | Hikmet et al. | |
| 2019/0299520 A1 | 10/2019 | Wieber et al. | |
| 2020/0152734 A1* | 5/2020 | Frougier | H01L 29/0649 |
| 2020/0220006 A1* | 7/2020 | Yang | H01L 29/0649 |

OTHER PUBLICATIONS

KIPO, Office Action of KR 10-2019-0011571 dated Jan. 28, 2020.

\* cited by examiner

FIELD-EFFECT TRANSISTOR WITHOUT PUNCH-THROUGH STOPPER AND FABRICATION METHOD THEREOF

CROSS REFERENCE TO RELATED APPLICATION

The present application claims priority to Korean Patent Application No. 10-2019-0011571, filed on Jan. 30, 2019, the entire contents of which are incorporated herein for all purposes by this reference.

DESCRIPTION

Technical Field

The present invention relates to a field effect transistor provided with an insulating film that prevents leakage current at the bottom of the channel and a method of manufacturing the same.

Background Art

A metal-oxide-semiconductor field effect transistor (MOSFET) is a device including three terminals respectively called a source, a drain, and a gate. The MOSFET has an N-type semiconductor channel or a P-type semiconductor channel. There are several types of MOSFETs. For example, MOSFETs can be classified into PMOSFETs and NMOSFETs according to a semiconductor material used therefor. There is also a CMOSFET in which both the PMOSFET and the NMOSFET are included.

MOSFETs function as switches or amplifiers which are key elements used in all kinds of electronic devices that perform logic operations. For example, MOSFETs are used for computers, cell phones, and Internet of things (IOT) devices.

The development of MOSFETs shows that per-cell cost reduction, performance enhancement, and power consumption reduction have been achieved through scaling down according to Moore's law.

In conventional MOSFETs, there is an effort to reduce a per-cell area and a cell operating voltage, thereby reducing power consumption required for driving cells, enhancing performance of cells, and reducing per-cell cost. However, as the cell size is reduced to tens of nanometers, the source-to-drain leakage current flowing into the region below the channel, which cannot be controlled via the gate, is increased, leading to increased power consumption.

Therefore, in order to effectively control the channel between the source and the drain, a fin-shaped field effect transistor (FinFET) and a gate-all-around field effect transistor (GAA FET) have been developed. The FinFET refers to a FET having a three-dimensional channel structure designed to dramatically enhance the ability of the gate to drive the channel. The GAA FET refers to a FET in which the gate entirely surrounds the channel. However, even with the FinFET and the GAA FET, the problem cannot be effectively solved.

A punch-through stopper (PTS) technique is another approach to effectively prevent the underneath-channel leakage current. According to this technique, impurities having the opposite conductivity to the source and the drain are implanted at a high dose into the source and the drain.

The punch-through stopper process is performed immediately before a process of forming a shallow trench isolation ("STI") region. Therefore, interface states such as dangling bonds appear on the surface underneath the channel during STI deposition and thermal annealing processes, thereby degrading the performance and reliability of the cells of a field effect transistor. The punch-through stopper process necessarily involves impurity implantation and heat treatment. Therefore, the step of forming punch-through stoppers is the most difficult to process during manufacturing of a conventional field effect transistor. Therefore, it often results in process-related troubles and productivity and yield reduction problems.

Usually, a source and drain forming process follows the punch-through stopper process. The source and drain are formed through selective epitaxial growth (SEG). Since the SEG involves a thermal process, there is a problem in that the impurities in the punch-through stopper formed through the punch-through stopper process diffuse into the channel, which lowers carrier mobility in the fabricated device.

This phenomenon occurs not only when in a case of polysilicon gate but also more seriously in a case of a replacement metal gate (RMG). That is, the impurities in the punch-through stopper diffuse into the channel during the STI and SEG processes, thereby increasing the trap density and the surface roughness of the gate oxide use in the replacement metal gate. As a result, device reliability and variability problems arise.

DOCUMENT OF RELATED ART

[Patent Document]
(Patent Document 1) Korean Patent Application Publication No. 10-2003-0070329 (2003 Aug. 30), Method of Manufacturing MOS Transistor with Self-Alignment Punch-through Stopper

DISCLOSURE

Technical Problem

As a result of various efforts made to fabricate a field effect transistor having a new structure instead of a punch-through stopper, an insulating film is formed between a source/drain region and a substrate to prevent underneath-channel leakage current. Therefore, it is confirmed that it is possible to prevent underneath-channel leakage without causing punch-stopper-related problems.

Accordingly, it is an objective of the present invention is to provide a field effect transistor and a method of manufacturing the same, which do not require the formation of a punch-through stopper.

Technical Solution

In order to achieve the above objective, the present invention provides a field effect transistor including: a substrate; first insulating films embedded in an upper portion of the substrate; a source region and a drain region respectively disposed on the first insulating films; a channel disposed between the source region and the drain region and configured to be in contact with the first insulating film disposed on the substrate; a gate disposed on the channel; and second insulating films formed on the channel so as to be in contact with respective side surfaces of the gate.

To achieve the objective of the present invention, the present invention provides a field effect transistor including: a substrate; first insulating films partially embedded in an upper portion of the substrate such that upper surfaces of the first insulating films are exposed; a source region and a drain region respectively disposed on the first insulating films; a plurality of horizontally extending channels and a plurality of spacings alternatively arranged in a vertical direction, the channels being disposed between the source region and the drain region and being in partial contact with the first insulating films; a gate disposed on the uppermost spacing of the plurality of spacings; and second insulating films vertically extending along respective side surfaces of the gate down to an upper surface of the substrate.

The present invention also provides a method of manufacturing a field effect transistor, the method including: (a) forming a channel, a gate, and a second insulating film on a substrate through a lithography process and an etching process; (b) etching along side surfaces of the channel and the second insulating film down to a predetermined depth of the substrate; (c) securing a first insulating film formation region in which a first insulating film is to be formed by etching the substrate through an additional etching process and forming the first insulating film by deposing an insulation material in the first insulating film formation region; and (d) forming a source region and a drain region on the first insulating film through a selective epitaxial growth (SEG) process.

The present invention also provides a method of manufacturing a field effect transistor, the method including: (a) forming a channel, a spacing, a gate, and a second insulating film on a substrate; (b) etching along side surfaces of the second insulating film, the channel, and the spacing down to a predetermined depth of the substrate to secure source and drain formation regions in which source and drain regions are to be formed and a first insulation film formation region in which a first insulating film is to be formed; (c) removing both end portions of the spacing through an etching process such that a portion of the channel is exposed, and filling spaces resulting from the removing with an insulation material; (d) forming the first insulating film by filling the first insulating film formation region with an insulation material; and (e) forming the source and drain regions on the first insulating films through a selective epitaxial growth (SEG) process, the source and drain regions being in contact with the channel and extending along a side surface of the second insulating film.

Advantageous Effects

Since the field effect transistor according to the present invention does not include a punch-through stopper, problems such as performance deterioration, reliability degradation, and variability of the device, which are attributable to formation of the punch-through stopper, are prevented.

In addition, since punch-through stoppers are not performed, the overall process can be simplified. That is, a difficult process (punch-through stopper) is eliminated from a manufacturing method of a field effect transistor, high productivity and yield can be achieved.

MODE FOR INVENTION

Figure 1:
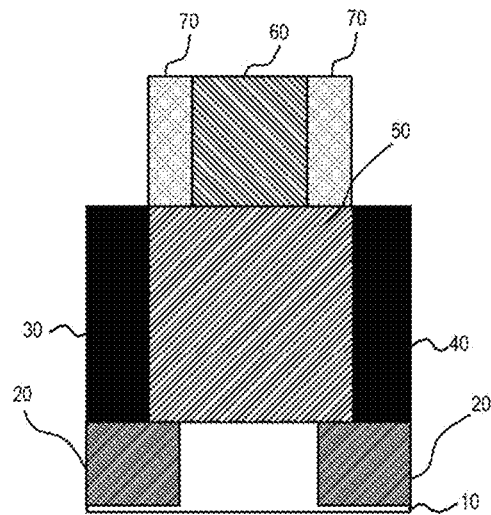
FIG. 1 is a cross-sectional view of a field effect transistor according to a first embodiment of the present disclosure.

Above objectives, other objectives, features, and advantages of the present invention will be readily understood from the following preferred embodiments associated with the accompanying drawings. However, the present invention is not limited to the embodiments described herein and may be embodied in other forms. The embodiments described herein are provided so that the disclosure can be made thorough and complete and that the spirit of the present invention can be fully conveyed to those skilled in the art.

In the present specification, when it is mentioned that a film (or layer) is on another film (or layer) or a substrate, it can be formed directly on another film (or layer) or a substrate, or formed with a third film disposed between them. In addition, the size and thickness of elements illustrated in the drawings are exaggerated for clarity. In addition, in various embodiments described herein, the terms "first", "second", "third", etc. are used to describe various regions, films (or layers), etc., but these regions, films (layers), etc. should not be limitedly defined by these terms. These terms are only used to distinguish any given region or film (or layer) from other regions or films (or layers). Thus, a film referred to as a first film in one embodiment may be referred to as a second film in other embodiments. Each embodiment described and illustrated herein also includes its complementary embodiment. The expression "and/or" is used herein to include at least one of the elements listed before and after. Like reference numerals denote like elements throughout the specification and drawings.

In field effect transistors, punch-through stoppers have the advantage of preventing leakage currents under channels that the gate cannot control, but the process for forming the punch-through stoppers lowers the performance and reliability of the manufactured device and causes problems such as variability. Accordingly, the present invention proposes a field effect transistor having a new structure that can replace a punch-through stopper and can achieve an equivalent or superior effect to the case where the punch-through stopper is used.

With reference to the drawings, a field effect transistor according to one embodiment will be described in more detail.

FIG. 1 is a cross-sectional view of a field effect transistor according to a first embodiment of the present disclosure. Specifically, the field effect transistor basically has the same structure as a metal oxide semiconductor field effect transistor (MOSFET).

Referring to FIG. 1, the field effect transistor includes a substrate 10, a first insulating film 20, Source and drain regions 30 and 40, a channel 50, a gate 60, and a second insulating film 70.

A conventional field effect transistor has a structure in which a punch-through stopper is formed under the channel. However, in the structure of the field effect transistor according to the present invention, the first insulating film is formed in an upper portion of the substrate 10 to replace the punch-through stopper.

Specifically, the first insulating film 20 is embedded in the substrate 10, and the source and drain regions 30 and 40 are formed on the first insulating film 20. The first insulating film 20 is partially in contact with the channel 50 at both ends of the channel 50, thereby maximizing a stress effect over the entire channel 50.

In addition, as shown in FIG. 1, the first insulating film 20 is formed to be substantially perpendicular to the surface of the substrate 10 through an anisotropic etching process. The first insulating film 20 may have a vertically protruding structure or a trench structure.

The material of the first insulating film 20 according to the present invention comprises at least one insulation material selected from the group consisting of $SiO_2$, $Al_2O_3$, $HfO_2$, $ZrO_2$, $Si_3N_4$, perovskite oxide, and combinations thereof. The insulation material of the first insulating film 20 effectively prevents leakage current that flows underneath the channel between the source region 30 and the drain region 40 because the gate 60 cannot electrically control the current. Therefore, it is possible to improve the performance of the field effect transistor. In addition, it is possible to improve cell performance by reducing parasitic capacitance such as junction capacitance between the source/drain regions 30/40 and the substrate 10.

Punch-through stoppers used in conventional transistors are formed through impurity implantation and heat treatment. Therefore, it is necessary to take much caution in forming the punch-through stoppers, and the formed punch-through stoppers cause various problems in the process of forming other components of a device. On the other hand, the first insulating film 20 in the field effect transistor according to the present invention is advantageous in that it is formed through a deposition process and has little or no influence on the subsequent process. That is, by forming the first insulating film 20 instead of the punch-through stopper, the problems caused by the conventional punch-through stopper process can be solved.

In addition, according to the present invention, the first insulating film 20 can suppress a high concentration of impurity ions implanted into the substrate 10 from diffusing into the substrate 10 during the SEG process for forming the source and drain regions 30 and 40. Therefore, in the substrate 10, the concentration of the impurity ions is very low and is specifically within a range of zero to $10^{18}$ cm$^{-3}$.

Hereinafter, a method of manufacturing the field effect transistor according to the first embodiment of the present invention will be described with reference to FIGS. 2 to 7.

Figure 2:
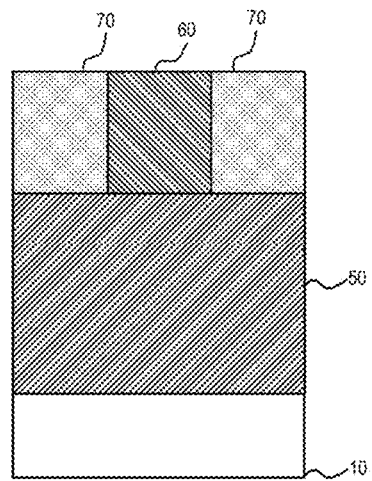
FIGS. 2 to 7 are cross-sectional views illustrating a method of manufacturing the field effect transistor according to the first embodiment of the present disclosure.

First, a channel 50, a gate 60, and a second insulating film 70 are formed on a substrate 10 through lithography and etching processes (see FIG. 2).

The substrate 10 is not particularly limited to a specific type of substrate in the present invention. One type of substrate among various types of substrates that are commonly used in this field may be used. For example, a material selected from the group consisting of Si, SiGe, Ge, Sn(tin), Group III compounds, Group IV compounds, and Group V compounds to which a top-down process can be applied may be used as a substrate material.

The substrate 10 may contain nearly no impurities, or may be doped with one or more n-type impurities selected from the group consisting of P, As, and Sb, or one or more p-type impurities selected from the group consisting of B, $BF_2$, Al, and Ga, in which the concentration of the impurities is $10^{18}$ cm$^{-3}$ or lower. The impurity introduced into the substrate 10 depends on device type (whether it is NMOS or PMOS). Specifically, a p-type impurity is used for NMOS and an n-type impurity is used for PMOS. As described above, although a high dose of impurity ions is implanted into the substrate, the first insulating film suppresses the impurity ions from diffusing into the substrate even through the SEG process. Therefore, the impurity concentration that is initially set in the substrate can be maintained until the manufacturing of the field effect transistor is finished.

The channel 50 may be comprised of at least one material selected from the group consisting of GaN, Si, Ge, SiGe, GaAs, W, Co, Pt, ZnO, and $In_2O$.

The gate 60 may be a polysilicon gate or a replacement metal gate. In this case, the polysilicon gate may be a highly doped polysilicon or/and silicide gate. The replacement metal gate may have a structure in which a gate oxide/metal barrier and a work function metal are stacked in this order.

The second insulating film 70 may be comprised of at least one material selected from the group consisting of $SiO_2$, $Al_2O_3$, $HfO_2$, $ZrO_2$, $Si_3N_4$, perovskite oxide, and combinations thereof, and the material of the second insulating film 70 may be the same as or different from the material of the first insulating film 20.

The channel 50, the gate 60, and the second insulating film 70 are formed on the substrate 10 through lithography and etching process after a known deposition process is performed.

Specifically, the channel 50 and the gate 60 are sequentially deposited on the substrate 10.

Chemical vapor deposition (CVD), plasma sputtering, evaporation, and atomic layer deposition (ALD) are deposition methods that can be used in for the deposition of the channel and the gate.

Specifically, a photoresist layer is first formed on a deposition layer. The deposition layer is then patterned to form the gate 60 through a lithography process and an etching process. Next, the second insulating film 70 is deposited at both sides of the gate 60 and on the substrate 70.

Lithography may be any one of electron beam lithography, nanoimprint, ion beam lithography, X-ray lithography, extreme ultraviolet lithography, photolithography (steppers, scanners, contact aligners, etc.) and randomly sprayed nanoparticles. The lithography is not particularly limited in the present invention.

In the etching process, wet etching and dry etching may be used. In this case, as an etching mask material, an insulation material such as $SiO_2$ or $SiN_x$, a metal such as Cr, Ni, Al, or photoresist may be used.

Figure 3:
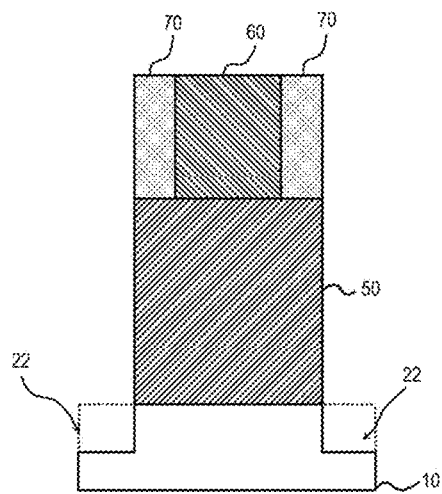

Next, the second insulating film 70, the channel 50, and the substrate 10 are partially removed through lithography and etching to form the source region 30 and the drain region 40 (see FIG. 3). Specifically, the second insulating film 70 and the channel 50 undergo side etching, and the exposed upper surface of the substrate 10 is partially etched for connection with the channel 50.

Figure 4:
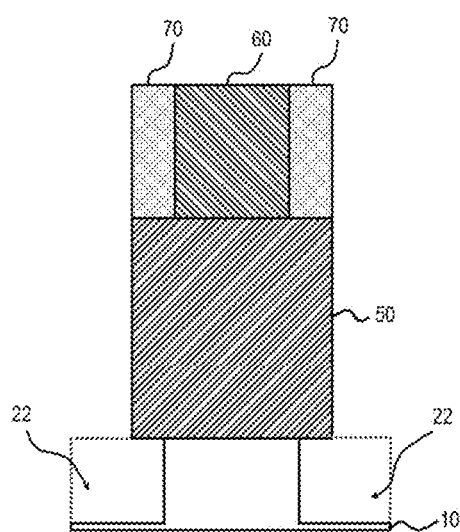

Next, the substrate 10 is further etched to secure a first insulation film formation region 22 in which the first insulating film 20 is to be formed (see FIG. 4). Through this etching, a portion of the bottom of the channel 50 is exposed.

Figure 5:
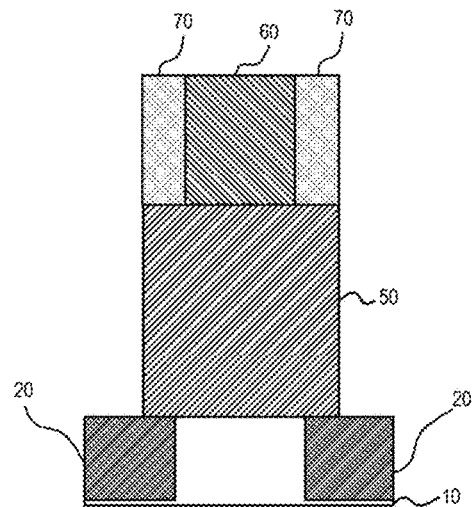

Next, an insulation material is deposited in the first insulation film formation region 22 to form the first insulating film 20 (see FIG. 5).

The first insulating film 20 may be formed through an existing deposition process such as atomic layer deposition (ALD), chemical vapor deposition (CVD), plasma enhanced-ALD (PE-ALD), or PE-CVD. The deposition method is not particularly limited in the present invention.

Figure 6:
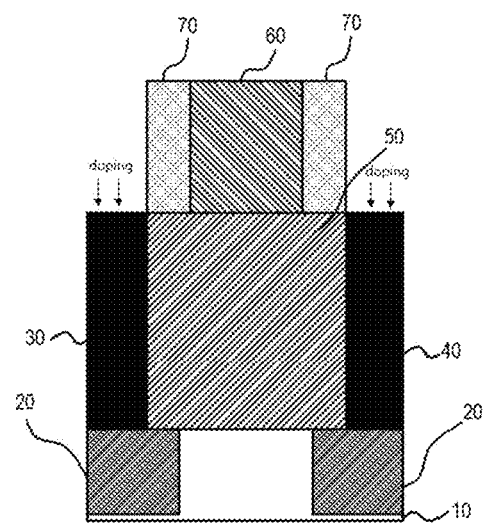

Next, the source region 30 and the drain region 40 are formed such that the upper surfaces of the source region 30 and the drain region 40 are in contact with the channel 50 formed on the first insulating film 20 (see FIG. 6).

A selective epitaxial growth (SEG) method may be used to form the source and drain regions 30 and 40. Through this process, the highly-doped source and drain regions 30 and 40 are formed.

In this case, the impurity type depends on the device type (NMOS or PMOS). The impurity type is n-type for NMOS and is p-type for PMOS. For example, one or more n-type impurities selected from the group consisting of P, As, and Sb may be used, and one or more p-type impurities selected from the group consisting of B, $BF_2$, Al, and Ga may be used. If necessary, in order to increase the stress effect throughout the channel 50, one or more materials selected from the group consisting of Si, SiGe, Ge, Sn (tin), Group III compounds, Group IV compounds, and Group V compounds may be used.

Subsequently, source and drain metals (not shown) respectively disposed on the source and drain regions 30 and 40 are formed to be connected to the source and drain regions 30 and 40. As the material, one of the metals that are commonly used in this field may be used. That is, one or more metals selected from the group consisting of Cu, Mo, Al, Ag, Ti, Nb, W, Cr, Ta, and alloys thereof may be used. The source/drain metals may be a single layer formed of the material described above or a multilayer such as a double layer (for example, a Ti/Cu layer). In this case, silicide may be formed between the source/drain regions 30/40 and the source/drain metals.

Figure 7:
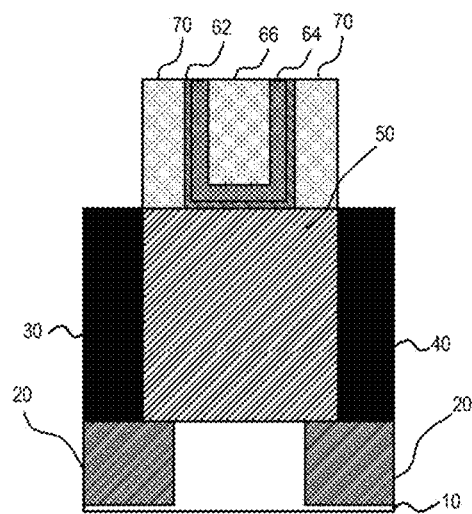

Alternatively, the polysilicon used as the gate 60 may be removed and the replacement metal gate 60 may be formed (see FIG. 7).

Specifically, the replacement metal gate 60 may be formed by removing the existing gate 60 and by sequentially depositing a gate oxide 62, a metal barrier 64, and a work function metal 66 in the region from which the existing gate is removed (see FIG. 7). When forming the replacement metal gate 60, lithography and etching may be performed.

The gate oxide 62 may be any one oxide selected from the group consisting of $SiO_2$, $Al_2O_3$, $HfO_2$, $ZrO_2$, $Si_3N_4$, and perovskite oxide.

The metal barrier may be made of Ti, TiN, or Al. The work function metal may be W, Al, Cr, Ni, or the like, and may be deposited through low pressure chemical vapor deposition (LPCVD).

The field effect transistor according to the exemplary embodiment of the present invention may improve the device performance by having the first insulating film 20 to replace a punch-through stopper, in a portion of the substrate 10. That is, since it is not necessary to form the punch-through stopper, various problems associated with the formation of the punch-through stopper do not occur.

The formation of the embedded first insulating film 20 may be applied to field effect transistors having various structures.

The structure of the field effect transistor of FIG. 1 is a classical structure. Instead of the structure of FIG. 1, the field effect transistor may have a structure selected from the group consisting of a planar double gate structure, a ultra-thin-body SOI structure, a multiple gate structure such as tri- or double-gate finFET structure, a gate-all-around structure, a lateral structure in which the channel extends horizontally, and a vertical structure in which the channel extends vertically.

Figure 8:
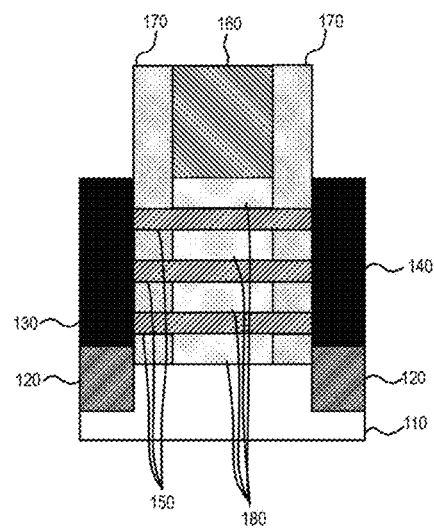
FIG. 8 is a cross-sectional view of a field effect transistor according to a second embodiment of the present disclosure.

FIG. 8 is a cross-sectional view illustrating a nanosheet field effect transistor (NSFET), as one exemplary FET structure, according to a second embodiment of the present invention. The structure of the NSFET shown in FIG. 8 is illustrated as a single stack in which nanosheets are stacked in three layers for convenience. However, the field effect transistor (FET) according to the present invention may have a multilayer single stack structure in which n or more layers are stacked. Alternatively, the field effect transistor may have a multilayer multi-stack structure including n or more stacks each stack being composed of n or more layers.

Referring to FIG. 8, the field effect transistor includes a substrate 110, first insulating films 120 partially embedded in an upper portion of the substrate 110, a source region 130 and a drain region 140 respectively positioned on the first insulating films 120, a plurality of horizontally extending channels 150 and a plurality of spacings 180 alternatively arranged in a vertical direction and positioned between the source region 130 and the drain region 140, a gate 150 disposed on the uppermost spacing 180 of the plurality of spacings 180, and second insulating films 170 disposed in contact with side surfaces of the source/drain regions 30/40 and side surfaces of the spacings 180, the second insulating films 170 vertically extending along respective side surfaces of the gate 160 down to the substrate 110.

The field effect transistor according to the second embodiment has a structure in which the first insulating films 120 are formed on the upper surface of the substrate 110 instead of the punch-through stoppers formed under the channel 150. In this case, the first insulating films 120 are embedded in the substrate 110 such that an upper portion of each of the first insulating films 120 is exposed. With the presence of the first insulating films 120, the source region 130 and the drain region 140 are separated from the substrate 110.

Due to the formation of the first insulating films 120, the effects of the first embodiment described above can be obtained.

Hereinafter, a method of manufacturing the field effect transistor shown in FIG. 8 will be described in detail with reference to FIGS. 9 to 15.

Figure 9:
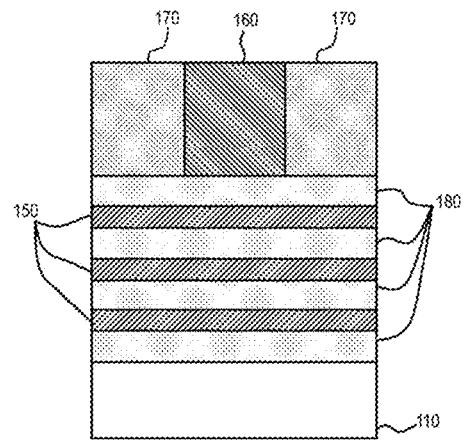
FIGS. 9 to 15 are cross-sectional views illustrating a method of manufacturing the field effect transistor according to the second embodiment of the present disclosure.

First, the channels 150, the spacings 180, the gate 160, and the second insulating films 170 are formed on the substrate 110 (see FIG. 9).

The channels 150 are nano sheet channels which are formed to extend parallel to the surface of the substrate 110 and are arranged in a perpendicular direction with respect to the substrate 110. The channel 150 has a nanosheet shape. The material of the channel 150 may be a nanowire, nanofiber, nanorod, or nanoribbon as known in the art. Alternatively, the channel 50 may be made of a P-type semiconductor or an N-type semiconductor. For example, the semiconductor material may be one material selected from the group consisting of Si, SiGe, or Ge, Group III-V compounds such as InGaAs, InAs, and InSb. However, the material of the channel may not be particularly limited in the present invention.

The width of the channel 150 in a direction parallel to the surface of the substrate 110 may range from 10 nm to 30 nm, and the thickness may range from 2 nm to 8 nm.

In addition, the material and the formation method of the gate 160 and the second insulating films 170 are the same as in the first embodiment. The spacings 180 may be made of at least one material selected from the group consisting of $SiO_2$, $Al_2O_3$, $HfO_2$, $ZrO_2$, $Si_3N_4$, perovskite oxide, and combinations thereof, and the material of the spacings 180 may be the same as or different from the material of the first insulating films 120.

Figure 10:
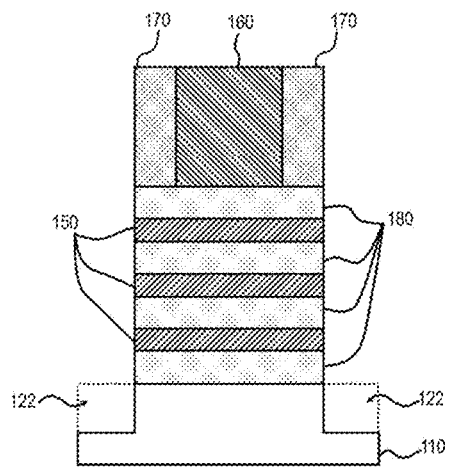

Next, the side surfaces of the second insulating films 170, the channels 150, and the spacings 180, and an upper portion of the substrate 110 are etched through lithography and etching processes to secure formation regions 122 in which the source/drain regions 130/140 and the first insulating films 120 are to be formed (see FIG. 10).

Specifically, the second insulating films 170 and the channels 150 undergo side etching, and the exposed upper surface of the substrate 110 is partially etched for connection with the channels 150. In this case, portions of the substrate 110, which are etched, are the formation region 122 in which the first insulating films are to be formed.

Figure 11:
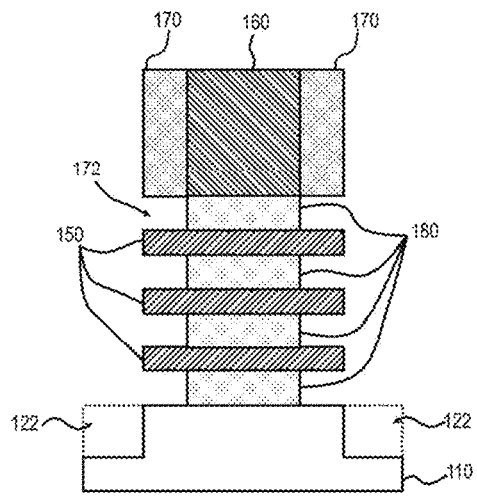

Next, an additional etching process is performed to etch both end portions of each of the spacings 180 so that a portion of each of the channels 150 is exposed (see FIG. 11).

In this case, the etching process is performed to selectively etch only the exposed spacing regions 180 using a difference in etching rate according to a material composition ratio or material difference between the channels 150 and the spacings 180. In order to remove performance deterioration factors such as irregular surface state density on a to-be-etched surface during the etching process, a film growing process and a wet etching process may be additionally performed. The etched spacing regions 180 become second insulating film formation regions 172 in which the second insulating films 170 are to be deposited.

The width of the channel 150 exposed to the outside has the same size as that of the second insulating film 170. A portion of the upper surface of the substrate 110 is exposed to the outside due to the additional etching of the spacings 180.

Figure 12:
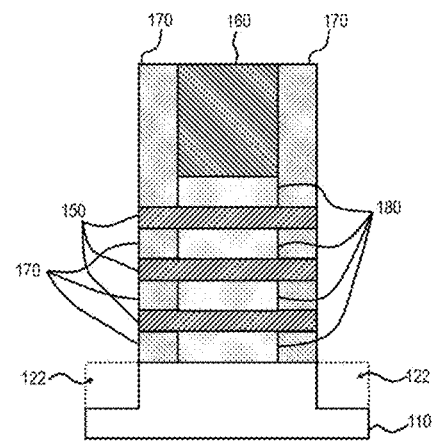

Next, a process of depositing an insulation material to fill the spacing regions 180 and the second insulating film formation regions 172 which are removed through the etching (see FIG. 12). In this case, the insulation material may be the same material as the second insulating films 170, or a known insulation material.

Figure 13:
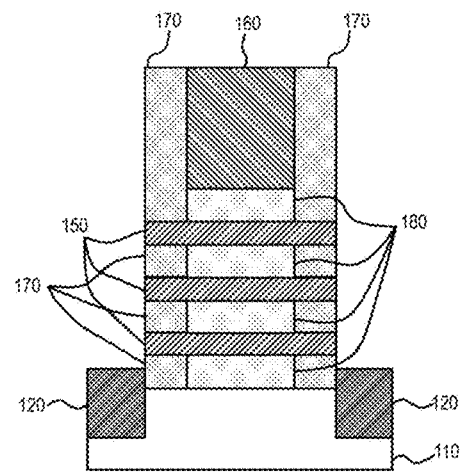

Next, an insulation material is deposited in the first insulation film formation regions 122 to form the first insulating films 120 (see FIG. 13). The deposition of the spacings 180 and the deposition of the first insulating films may be performed in the same step or in different steps.

In this case, the width of the first insulating film 120 is the same as the width of the etched portion of the substrate 110, and the height of the first insulating film 120 may be the distance to the lower end of the lowermost channel 150. Preferably, it is important that the first insulating film 120 is not in contact with the channel 150.

Figure 14:
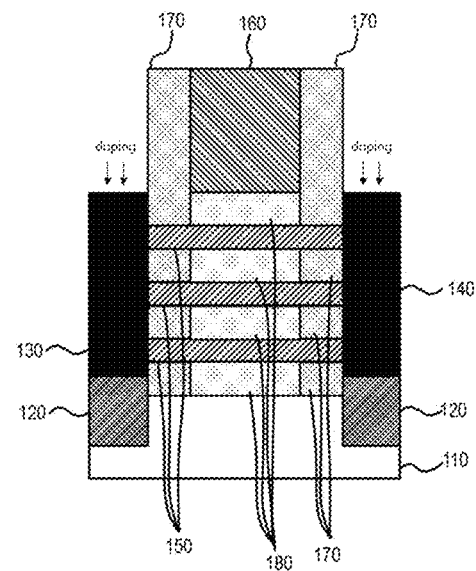

Next, the source region 130 and the drain region 140 are formed to be in contact with the channel 150 and formed along the side walls of the second insulating films 170 (see FIG. 14).

In this case, the width of the source/drain regions 130/140 may be the same as, or narrower or wider than the width of the etched portion of the substrate 110. It is important that the height of the source/drain regions 130/140 may be the distance from the first insulating film 120 to the lower end of the gate 160. Preferably, the source/drain regions 130/140 need to be in contact with all of the plurality of channels 150.

Next, a gate-all-around (GAA) structure in which the gate surrounds the channel 150 is formed. This structure suppresses the short channel effect and the leakage current and increases the gate width, thereby enhancing the ability to drive the field effect transistor.

Figure 15:
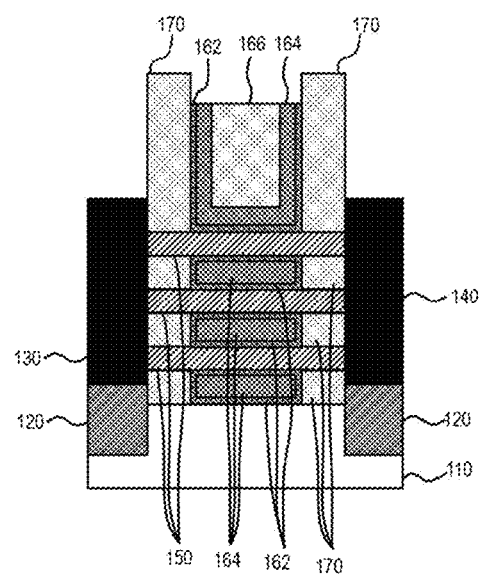

In order to form a GAA structure, the existing gate 160 and the spacing 180 are removed. Next, the exposed regions after the existing gate 160 and the spacing 180 are removed are oxidized to form a gate oxide 162. Next, a metal barrier 164 and a work function metal 166 are sequentially stacked (see FIG. 15). Although FIG. 15 illustrates a case where the work function metal 166 does not exist on the metal barrier 164 within the spacing region 180, the work function metal 166 may be included if necessary.

The removal of the gate 160 and the spacing 180 may be performed through an etching process. The removal of the gate 160 and the removal of the spacing 180 may be sequentially or simultaneously performed.

In addition, the type and manufacturing method of the gate oxide 162, the metal barrier 164, and the work function metal 166 are the same as in the first embodiment.

Through this process, a gate (which is composed of a gate oxide 162 and a metal barrier 164) is formed in the region previously occupied by the gate 160 and the spacing 180. That is, a GAA structure in which the upper surface, the lower surface, and the side surfaces of the channel 150 are surrounded by a gate is formed.

Thereafter, silicide layers and source/drain metals are formed on the source/and drain regions 130/140 through a conventional process.

In the field effect transistor according to the second embodiment of the present invention, the first insulating films 120 are formed to be embedded in the substrate 110 instead of formation of punch-through stoppers. The first insulating films 120 have a height to the extent that the first insulating films 120 are partially exposed. That is, upper portions of the first insulating films 120 protrude from the upper surface of the substrate 110. The first insulating film 120 performs the same function as the punch-through stopper. That is, the first insulating film 120 may improve the device performance by reducing or minimizing leakage current occurring under the channel, which cannot be controlled by the gate. That is, since it is not necessary to form the punch-through stopper, various problems associated with the formation of the punch-through stopper do not occur.

While the embodiments of the present invention have been described above with reference to the accompanying drawings, the present invention may be embodied in other specific forms without departing from the technical spirit or essential features of the present invention. Therefore, it should be understood that the embodiments described above are only for illustrative purposes in all respects and are not restrictive.

DESCRIPTION OF SYMBOLS 10, 110: substrate
20, 120: first insulating film
22, 122: first insulating film formation region
30, 130: source region
40, 140: drain region
50, 150: channel
60, 160: gate
62, 162: gate oxide
64, 164: metal barrier
66, 166: work function metal
70, 170: second insulating film
172: second insulating film formation region
180: spacing

The invention claimed is:
1. A fin field effect transistor (FinFET) comprising:
a substrate;
two first insulating films embedded in an upper portion of the substrate;
an epitaxially grown source region and an epitaxially grown drain region disposed on the respective first insulating films;

a semiconductor channel disposed between the source region and the drain region and formed to partially cover the first insulating films;

a gate disposed on the semiconductor channel; and second insulating films in contact with respective side surfaces of the gate, wherein the substrate is composed of two first parts and one second part a thickness of the second part is thicker than the thickness of the two first parts, and the second part of the substrate is disposed between the two first parts, wherein the semiconductor channel is directly connected to the second part of the substrate, and the width of the semiconductor channel is greater than the width of the second part of the substrate, wherein each of the two first insulating films is disposed on each of the two first parts of the substrate, and a portion of the upper surface of each of the two first insulating films directly contacts a portion of the bottom of the semiconductor channel, wherein the fin field effect transistor comprises no punch-through stoppers.

2. The fin field effect transistor according to claim 1, wherein the first and second insulating films comprise at least one insulation material selected from the group consisting of $SiO_2$, $Al_2O_3$, $HfO_2$, $ZrO_2$, $Si_3N_4$, perovskite oxide, and combinations thereof.

3. The fin field effect transistor according to claim 1, wherein the substrate comprises one or more materials selected from the group consisting of silicon, germanium, tin, Group III compounds, Group IV compounds, Group V compounds, and heterogeneous compounds thereof.

4. The fin field effect transistor according to claim 1, wherein the gate is a polysilicon gate or a replacement metal gate.

5. The fin field effect transistor according to claim 1, wherein the field effect transistor is a metal oxide semiconductor field effect transistor (MOSFET).

* * * * *